(12) United States Patent
Kishimoto et al.

(10) Patent No.: US 7,733,112 B2
(45) Date of Patent: Jun. 8, 2010

(54) SEMICONDUCTOR TESTING CIRCUIT AND SEMICONDUCTOR TESTING METHOD

(75) Inventors: Satoshi Kishimoto, Osaka (JP); Tomohiko Kanemitsu, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/173,860

(22) Filed: Jul. 16, 2008

(65) Prior Publication Data

US 2009/0021279 A1    Jan. 22, 2009

(30) Foreign Application Priority Data

Jul. 18, 2007    (JP) .............................. 2007-186384

(51) Int. Cl.
*G01R 31/02* (2006.01)
*G01R 31/26* (2006.01)
*G01R 31/28* (2006.01)

(52) U.S. Cl. ............... 324/765; 324/763; 324/158.1; 714/30; 714/733

(58) Field of Classification Search ......... 324/754–765; 714/30, 733

See application file for complete search history.

(56) References Cited

U.S. PATENT DOCUMENTS

| 4,904,883 | A  | * | 2/1990  | Iino et al. ............. 327/198 |
| 6,275,055 | B1 | * | 8/2001  | Hyozo et al. .......... 324/755 |
| 6,720,785 | B2 | * | 4/2004  | Bette .................... 324/765 |
| 7,466,159 | B2 | * | 12/2008 | Ito et al. ............... 324/763 |
| 2003/0038650 | A1 | * | 2/2003 | Combs et al. ......... 324/765 |

FOREIGN PATENT DOCUMENTS

JP    10-288647    10/1998

* cited by examiner

*Primary Examiner*—Ha Tran T Nguyen
*Assistant Examiner*—Emily Y Chan
(74) *Attorney, Agent, or Firm*—Steptoe & Johnson LLP

(57) ABSTRACT

A semiconductor testing circuit of the present invention includes a signal line which is connected to a terminal not to be tested and a plurality of terminals to be tested of a semiconductor device; switch circuits for controlling electrical connection/disconnection between the signal line and the terminals to be tested; and a resistor connected to one end of the signal line. With this configuration, in a test on the AC characteristics of an input signal, a test signal generated by an LSI tester can be inputted to the terminals to be tested through the terminal not to be tested and the signal line by turning on the switch circuits.

8 Claims, 10 Drawing Sheets

SEMICONDUCTOR TESTING CIRCUIT AND SEMICONDUCTOR TESTING METHOD

FIELD OF THE INVENTION

The present invention relates to a semiconductor testing circuit contributing to a test on the AC characteristics of a semiconductor device such as an LSI, and a semiconductor testing method.

BACKGROUND OF THE INVENTION

In a test on the AC characteristics of a semiconductor device, measurements of a propagation delay time, a setup time, a hold time, a response time and so on are made on an input signal and an output signal of the semiconductor device. Generally, in the test configuration, the power supply unit and the measuring unit of an LSI tester are respectively connected to a power supply terminal and a terminal to be tested of the semiconductor device.

A method of testing the AC characteristics of a semiconductor device will be simply described below. As an example, the following will describe a test on the AC timing characteristics of a logic LSI and so on. When the AC timing characteristics of an input signal are tested, first, a test signal is inputted to a terminal to be tested (an input terminal or an input/output terminal) and a clock signal having a given phase difference beforehand from the test signal is inputted to a clock terminal. Next, a signal latched by a first stage flip-flop connected to the terminal to be tested is compared with an expected value. After that, the delay time and the phase difference of the input signal relative to a reference signal are measured based on the comparison result. On the other hand, when the AC timing characteristics of an output signal are tested, the internal circuit of the semiconductor device is operated to transmit the output signal from a terminal to be tested (an output terminal or an input/output terminal) to the outside of the semiconductor device. After that, the delay time and the phase difference of the output signal relative to the reference signal are measured by comparing the output signal having been transmitted to the outside with the expected value at a desired time.

Moreover, in tests on the AC characteristics of semiconductor devices, a plurality of semiconductor devices have been simultaneously tested in order to suppress the cost of the tests. In other words, the power supply unit and the measuring unit of an LSI tester are respectively connected to the power supply terminal and a terminal to be tested of each semiconductor device, and power and signals are supplied to the semiconductor devices at the same timing, so that the plurality of semiconductor devices are simultaneously tested.

However, in recent years, semiconductor devices have had a larger number of pins and the number of measuring units has been more frequently deficient in simultaneous tests on a plurality of semiconductor devices. This is because in tests on AC characteristics in the prior art, the number of measuring units has to be at least as many as the total number of terminals to be tested of a plurality of semiconductor devices to be simultaneously tested.

Further, in a proposed method, a path connecting one terminal to terminals to be tested is provided in a semiconductor device, so that the AC characteristics of a large number of terminals to be tested can be tested using a small number of terminals (for example, see Japanese Patent Laid-Open No. 10-288647).

This method can suppress the number of terminals of semiconductor devices connected to the measuring units of an LSI tester. Thus it is possible to test the AC characteristics of semiconductor devices with a small number of measuring units and increase the number of semiconductor devices which can be simultaneously tested.

However, only with the path connecting one terminal to terminals to be tested in a semiconductor device, the terminals to be tested have to be tested one by one, so that the test time increases and the test efficiency does not improve.

DISCLOSURE OF THE INVENTION

The present invention is devised in view of the foregoing problem. An object of the present invention is to provide a semiconductor testing circuit and a semiconductor testing method which can simultaneously test a large number of terminals to be tested of a semiconductor device with a small number of measuring units and improve test efficiency in a test on the AC characteristics of the semiconductor device.

In order to attain the object, a first semiconductor testing circuit of the present invention includes: a first signal line connected to a terminal not to be tested and a plurality of terminals to be tested of the semiconductor device; first switch circuits for controlling electrical connection/disconnection between the terminals to be tested and the first signal line; and a first resistor connected to one end of the first signal line, wherein at least the first signal line and the first switch circuits are formed on the semiconductor device.

The first semiconductor testing circuit may further include a second switch circuit for controlling electrical connection/disconnection between the first signal line and the first resistor.

Moreover, the first resistor may be provided outside the semiconductor device.

The first semiconductor testing circuit may further include a third switch circuit for controlling electrical connection/disconnection between the first signal line and the terminal not to be tested.

The first semiconductor testing circuit may further include input condition setting circuits respectively disposed between the terminals to be tested and the first signal line, the input condition setting circuit being capable of changing one of the logical value and a delay amount of a signal inputted from the first signal line to the terminal to be tested through the first switch circuit. Moreover, in this case, the first switch circuit may be changed among a state in which the first signal line and the terminal to be tested are electrically connected to each other via the input condition setting circuit, a state in which the first signal line and the terminal to be tested are electrically connected to each other not via the input condition setting circuit, and a state in which the first signal line and the terminal to be tested are electrically disconnected from each other.

A second semiconductor testing circuit of the present invention includes: a second signal line connected to a reference terminal of the semiconductor device, the reference terminal supplying, to the outside of the semiconductor device, a clock signal having passed through an internal clock tree of the semiconductor device; flip-flop circuits with selectors each of which include a flip-flop having at least an output pin, a clock pin, and a first input pin, and a selector having second and third input pins and electrically connecting the first input pin and one of the second and third input pins, the second input pins being respectively connected to terminals to be tested of the semiconductor device, the clock pins being connected to the second signal line; fourth switch circuits for controlling electrical connection/disconnection between the second input pins of the flip-flop circuits with the selectors and the terminals to be tested; third signal lines each of which connect the third input pin of the flip-flop circuits with the selectors to the output pin of the adjacent flip-flop circuit with the selector, and connect the output pin of the flip-flop circuit with the selector to a terminal not to be tested of the semiconductor device when the output pin is not connected to the third input pin; a fifth switch circuit for controlling electrical connection/disconnection between the second signal line and the reference terminal; and a second resistor connected to one end of the second signal line, wherein at least the second signal line, the flip-flop circuits with the selectors, the fourth switch circuits, the third signal lines, and the fifth switch circuit are formed on the semiconductor device.

Further, the second resistor may be provided outside the semiconductor device.

The second semiconductor testing circuit may further include a sixth switch circuit for controlling electrical connection/disconnection between the terminal not to be tested and the output pin of the flip-flop circuit with the selector.

A first semiconductor testing method of the present invention is a semiconductor testing method of testing, by using the first semiconductor testing circuit, the AC characteristics of an input signal inputted to terminals to be tested of a semiconductor device, the method including the steps of: operating the first switch circuits so as to electrically connect the terminals to be tested and the first signal line; inputting a test signal to the first signal line through the terminal not to be tested of the semiconductor device, supplying, to the semiconductor device, a clock signal having a desired phase difference from the test signal, and causing first stage flip-flops provided in the internal circuit of the semiconductor device to respectively latch signals from the terminals to be tested; and comparing the signals latched by the first stage flip-flops with an expected value.

In the first semiconductor testing method, when the input condition setting circuits are provided, the logical value or the delay amount of each of the input condition setting circuits is set before the test signal is inputted to the first signal line.

A second semiconductor testing method of the present invention is a semiconductor testing method of testing, by using the second semiconductor testing circuit, the AC characteristics of an output signal supplied from terminals to be tested of the semiconductor device to the outside of the semiconductor device, the method including the steps of: measuring the delay amount of the clock signal supplied from the reference terminal of the semiconductor device to the outside of the semiconductor device through the internal clock tree of the semiconductor device, the reference terminal being connected to the second signal line; operating the fourth switch circuits so as to electrically connect the terminals to be tested and the second input pins of the flip-flop circuits with the selectors, operating the fifth switch circuit so as to electrically connect the second signal line and the reference terminal, and operating the selectors of the flip-flop circuits with the selectors so as to electrically connect the first input pins and the second input pins of the flip-flop circuits with the selectors; supplying a clock signal to the semiconductor device to operate the internal circuit of the semiconductor device, inputting a clock signal to the reference terminal at a desired time based on the measured delay amount when signals are supplied from last stage flip-flops provided in the internal circuit to the terminals to be tested, and causing the flip-flops of the flip-flop circuits with the selectors to latch signals supplied from the terminals to be tested to the outside of the semiconductor device; operating the selectors of the flip-flop circuits with the selectors so as to electrically connect the first input pins and the third input pins of the flip-flop circuits with the selectors, and serially transmitting, to the terminal not to be tested of the semiconductor device, the signals latched by the flip-flop circuits with the selectors; and comparing the signals serially transmitted to the terminal not to be tested with an expected value.

According to a preferred embodiment of the present invention, in a test on the AC characteristics of a semiconductor device, it is possible to simultaneously test a large number of terminals of the semiconductor device with a small number of measuring units, thereby improving test efficiency. Further, it is possible to increase the number of semiconductor devices which can be simultaneously tested, thereby reducing the cost of equipment and test.

In other words, since the resistor (termination resistor) is provided on one end of the first signal line, it is possible to suppress the reflection of a signal on the first signal line. Therefore, in a test on the AC characteristics of the input signal inputted to the terminals to be tested, the test signal can be inputted simultaneously to the terminals to be tested through the first signal line, so that a large number of terminals of, the semiconductor device can be simultaneously tested with a small number of measuring units.

Moreover, by providing the input condition setting circuits, signals having different logical values and delay amounts can be simultaneously inputted to the respective terminals to be tested. Therefore, it is possible to test the terminals to be tested under different conditions, thereby increasing the number of terminals which can be simultaneously tested.

Further, by providing the flip-flop circuits with the selectors, in a test on the AC characteristics of the output signals supplied from the terminals to be tested to the outside of the semiconductor device, the output signals can be latched by the flip-flop circuits with the selectors and the latched signals can be serially transmitted to the single terminal not to be tested, the terminal being connected to an LSI tester. Thus it is possible to simultaneously test a large number of terminals of the semiconductor device with a small number of measuring units.

As described above, according to the semiconductor testing circuit and the semiconductor testing method of the present invention, it is possible to simultaneously test a large number of terminals of the semiconductor device with a small number of resources. Thus it is possible to improve the test efficiency of the semiconductor device and reduce the cost of test and equipment.

DESCRIPTION OF THE EMBODIMENTS

First Embodiment

Figure 1:
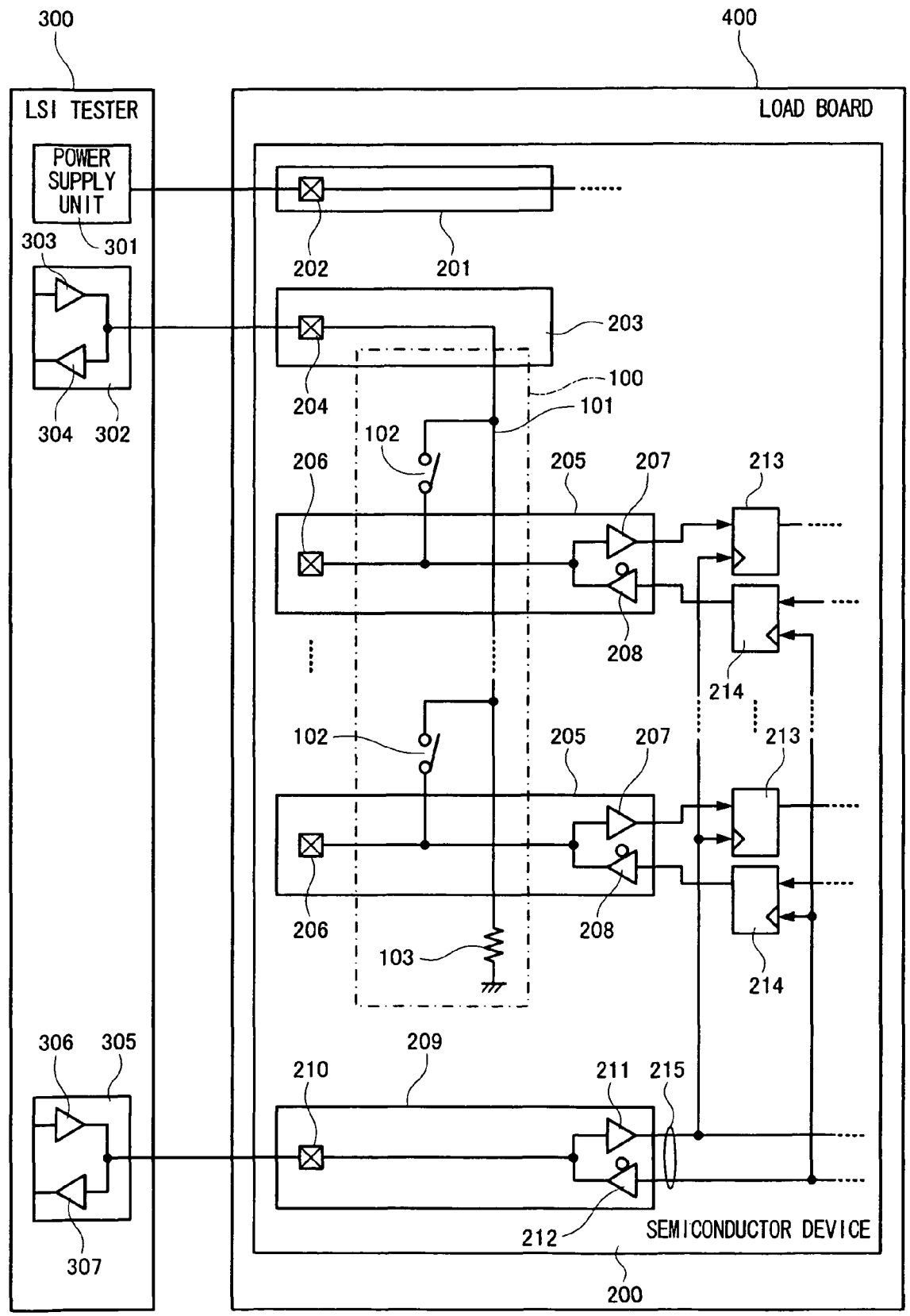
FIG. 1 is a schematic diagram showing an example of the test configuration of a semiconductor device including a semiconductor testing circuit according to a first embodiment of the present invention.

FIG. 1 schematically shows the test configuration of a semiconductor device including a semiconductor testing circuit according to a first embodiment of the present invention. The semiconductor testing circuit of the first embodiment is used for testing the AC characteristics of an input signal and an output signal of a semiconductor device such as an LSI. The configurations of an LSI tester and the semiconductor device are partially shown in FIG. 1.

The first embodiment will describe an example of a test on the AC timing characteristics of a semiconductor device including first stage flip-flops and last stage flip-flops which are respectively connected to a plurality of input/output terminals. As a matter of course, the use of the semiconductor testing circuit and the semiconductor testing method of the present invention is not limited to the semiconductor device configured thus.

As shown in FIG. 1, a semiconductor testing circuit 100 is provided in a semiconductor device 200 that is a device to be measured. The semiconductor device 200 is mounted on a load board 400 acting as an interface connecting the semiconductor device 200 and an LSI tester 300 during a test. The semiconductor device 200 may be mounted on a wafer or molded in a package. The LSI tester 300, the semiconductor device 200, and the semiconductor testing circuit 100 will be described in this order.

In the LSI tester 300, a power supply unit 301 generates power supplied to the semiconductor device 200. The power supply unit 301 is connected, via the load board 400, to a pad 202 of a power supply terminal 201 provided in the semiconductor device 200.

Further, a first measuring unit 302 has a function of generating, at any given time, a test signal (logic signal) to be supplied to the semiconductor device 200, and a function of observing an output signal (logic signal) from the semiconductor device 200. The first measuring unit 302 is connected, via the load board 400, to a pad 204 of a first input/output terminal 203 provided in the semiconductor device 200.

To be specific, the first measuring unit 302 includes a driver 303 for generating the test signal at the given time based on a reference signal generated in the LSI tester 300, and a comparator 304 for observing the logical value of the output signal by comparing the output signal from the semiconductor device 200 with a specified value. The LSI tester 300 measures the delay time of the output signal relative to the reference signal and a phase difference and so on between the output signal and the reference signal by comparing an observation result of the comparator 304 (the logical value of the output signal) and an expected value at a desired time.

A second measuring unit 305 has a function of generating, at any given time, a clock signal to be supplied to the semiconductor device 200, and a function of observing the clock signal from the semiconductor device 200, that is, the clock signal having passed through the internal clock tree of the semiconductor device 200 (hereinafter, sometimes referred to as an output clock signal). The second measuring unit 305 is connected, via the load board 400, to a pad 210 of a clock terminal 209 provided in the semiconductor device 200.

To be specific, the second measuring unit 305 includes a driver 306 for generating the clock signal at the given time based on the reference signal generated in the LSI tester 300, and a comparator 307 for observing the rising edge and the falling edge of the output clock signal by comparing the output clock signal and a specified value. The LSI tester 300 measures the delay time of the output clock signal relative to the reference signal and a phase difference and so on between the output clock signal and the reference signal by observing the timing of the rising edge and the falling edge of the output clock signal based on an observation result of the comparator 307.

The following will describe the semiconductor device 200. The semiconductor device 200 includes, as external terminals, the power supply terminal 201 connected to the power supply unit 301 of the LSI tester 300, the first input/output terminal 203 connected to the first measuring unit 302 of the LSI tester 300, second input/output terminals 205 which are terminals to be tested, and the clock terminal (reference terminal) 209 connected to the second measuring unit 305 of the LSI tester 300. These terminals include at least pads for connection to an external circuit. Further, in this configuration, the second input/output terminals 205 and the clock terminal 209 include input buffers (gates) 207 and 211 and output buffers (tri-state buffers) 208 and 212. These buffers are connected to pads 206 of the second input/output terminals 205 and the pad 210 of the clock terminal 209.

The pads 206 of the second input/output terminals 205 are connected to the data input pins of first stage flip-flops 213 via the input buffers 207. Further, the pads 206 of the second input/output terminals 205 are connected to the data output pins of last stage flip-flops 214 via the output buffers 208.

The pad 210 of the clock terminal 209 is connected to an internal clock tree 215 of the semiconductor device 200 via the input buffer 211 and the output buffer 212. The clock terminal 209 is a terminal which is fed, from the outside, with the clock signal for operating the internal circuit of the semiconductor device 200 and supplies, to the outside, the clock signal (output clock signal) having passed through the internal clock tree 215 of the semiconductor device 200. The clock pins of the first stage flip-flops 213 and the last stage flip-flops 214 are connected to the internal clock tree 215.

The following will describe a test on a single semiconductor device. As a matter of course, a plurality of semiconductor devices can be simultaneously tested. In this case, the power supply unit 301 and the measuring units 302 and 305 are connected to each of the semiconductor devices.

Further, the following explanation will describe an example in which the terminal fed with the clock signal from the outside and the terminal for supplying the clock signal to the outside are included in the single clock terminal 209. As a matter of course, these terminals may be separately provided.

The following will describe the semiconductor testing circuit 100. In the semiconductor testing circuit 100, a signal line (first signal line) 101 is made up of a main part and branch parts. One end of the main part of the signal line 101 is connected near the pad 204 of the first input/output terminal (not to be tested) 203 connected to the first measuring unit 302 of the LSI tester 300. The branch parts of the signal line 101 are respectively provided for the second input/output terminals 205. Each of the branch parts is connected near the pad 206 of the second input/output terminal 205 via a switch circuit (first switch circuit) 102. Each of the switch circuits 102 controls electrical connection/disconnection between the second input/output terminal 205 and the signal line 101. The other end of the main part of the signal line 101 is connected to a resistor (first resistor) 103 acting as a termination resistor. The signal line 101, the switch circuits 102, and the resistor 103 are formed on the semiconductor device 200.

With this configuration, during a test on the AC timing characteristics of the input signal, the switch circuits 102 connected to the second input/output terminals 205 to be tested are turned on, so that a test signal supplied from the LSI tester 300 to the first input/output terminal 203 can be inputted, through the path of the signal line 101, to the gates (input buffers 207) of the second input/output terminals 205 to be tested.

Further, during a test on the AC timing characteristics of the output signal, the switch circuits 102 connected to the second input/output terminals 205 to be tested are turned on, so that output signals from the output buffers 208 of the second input/output terminals 205 can be transmitted to the LSI tester 300 through the signal line 101 and the first input/output terminal 203.

During a normal operation of the semiconductor device 200, the switch circuits 102 are turned off, so that the second input/output terminals 205 can be disconnected from the signal line 101. Thus during the normal operation of the semiconductor device 200, the semiconductor testing circuit 100 does not affect the operation of the internal circuit of the semiconductor device 200.

Further, only necessary ones of the multiple terminals to be tested can be electrically connected to the signal line 101, and the other terminals not to be simultaneously fed with the test signal can be disconnected from the signal line 101. Moreover, during a test on the AC timing characteristics of the output signal, any one of the multiple terminals to be tested can be electrically connected to the signal line 101.

The switch circuit 102 can be turned on/off by providing a circuit (not shown) in, for example, the semiconductor device 200 to turn on/off the switch circuit 102 according to an instruction signal optionally generated in the LSI tester 300.

The resistor 103 provided on the end of the signal line 101 is disposed near the second input/output terminal 205 farthest from the junction point of the first input/output terminal 203 and the signal line 101. The resistor 103 can suppress the reflection of a signal transmitted through the signal line 101 even when the signal is a pulse signal such as a logic signal or an AC sine wave signal.

In the test on the AC timing characteristics, the delay time of a signal transmitted between the pad of a terminal to be tested and the first stage or last stage flip-flop is observed. Thus the signal line 101 is connected as close as possible to the pads of the terminals to be tested. Further, in order to transmit a signal having an undistorted waveform through the signal line 101, the lengths of the branch parts of the signal line 101 are minimized. Therefore, it is preferable to form the semiconductor testing circuit 100 in a region under a region where the pads of the terminals to be tested are formed.

The following will describe a method of testing the AC timing characteristics, as a semiconductor testing method according to the first embodiment of the present invention. In a test on the AC timing characteristics of the input signal, the test signal is supplied to the terminals to be tested in the semiconductor device 200 and the clock signal is supplied to the clock terminal 209 of the semiconductor device 200 at a desired time. Then, by comparing a signal latched by the first stage flip-flop 213 with the expected value, the delay time of the input signal relative to the reference signal and a phase difference and so on between the input signal and the reference signal are measured. In a test on the AC timing characteristics of the output signal, the internal circuit of the semiconductor device 200 is operated to measure the delay time and the phase difference of the output signal relative to the reference signal by comparing the output signal from the semiconductor device 200 with the expected value at a desired time.

Figure 2:
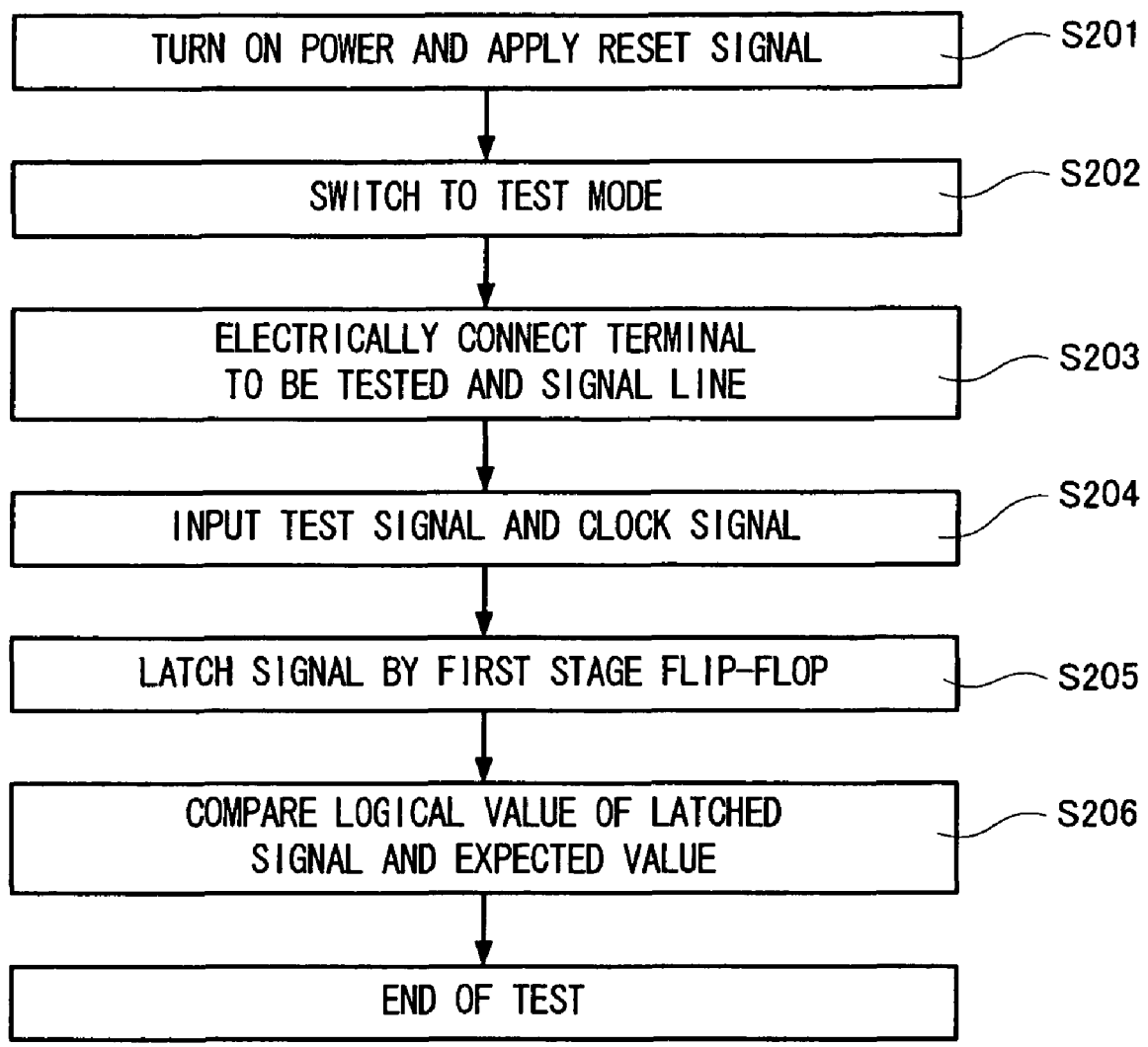
FIG. 2 is a flowchart showing an example of a semiconductor testing method according to the first embodiment of the present invention.

Referring to FIG. 2, the following will specifically describe an example of a test on the AC timing characteristics of the input signal.

First, the LSI tester 300 starts power supply (power-up) to the semiconductor device 200 that is a device to be measured, and then applies a reset signal to the semiconductor device 200 (step S201). Thereafter, the LSI tester 300 switches the semiconductor device 200 to a state (test mode) in which the AC timing characteristics of the input signal are tested (step S202).

Next, the LSI tester 300 turns on the switch circuits 102 connected to the second input/output terminals 205 to be simultaneously tested and electrically connects the second input/output terminals to the signal line 101 (step S203).

Then, the LSI tester 300 generates, in the first measuring unit 302, the test signal for testing the AC timing characteristics of the input signal, inputs the test signal to the signal line 101 through the first input/output terminal 203, generates the clock signal in the second measuring unit 305 at a desired time, and inputs the clock signal to the internal clock tree 215 through the clock terminal 209 (step S204). A desired phase difference is set between the clock signal and the test signal. The set value of the phase difference is an AC timing characteristic value to be tested and corresponds to, for example, a setup time and a hold time.

The test signal generated in the first measuring unit 302 is inputted through the signal line 101 to the input buffers (gates) 207 of the second input/output terminals 205 to be simultaneously tested. The test signal having been inputted to the input buffers 207 is inputted to the data input pins of the first stage flip-flops 213. On the other hand, the clock signal generated in the second measuring unit 305 is inputted to the clock pins of the first stage flip-flops 213 through a part of the internal clock tree 215.

The first stage flip-flop 213 latches the signal inputted to the data input pin, at the rising edge or the falling edge of the clock signal (step S205). The signal latched by the first stage flip-flop 213 is compared with the expected value in a comparator circuit (not shown) provided beforehand in the semiconductor device 200 (step S206). The expected value is the logical value of the test signal. Based on the comparison result, it is possible to measure the delay time and so on of the input signal relative to the reference signal. The signal latched by the first stage flip-flop 213 may be transmitted from an external terminal (not shown) of the semiconductor device 200 to the LSI tester 300 and may be compared with the expected value in the LSI tester 300.

The following will describe an example of a test on the AC timing characteristics of the output signal.

First, the LSI tester 300 starts power supply to the semiconductor device 200, and then applies the reset signal to the semiconductor device 200. Thereafter, the LSI tester 300 switches the semiconductor device 200 to a state (test mode) in which the AC timing characteristics of the output signal are tested.

Next, the LSI tester 300 turns on the switch circuits 102 connected to the second input/output terminals 205 to be simultaneously fed with the test signal, and electrically connects the second input/output terminals 205 to the signal line 101.

Then, the LSI tester 300 generates, in the first measuring unit 302, the test signal for testing the AC timing characteristics of the output signal, inputs the test signal to the signal line 101 through the first input/output terminal 203, generates, in the second measuring unit 305, the clock signal for operating the internal circuit of the semiconductor device 200, and inputs the clock signal to the internal clock tree 215 through the clock terminal 209.

The test signal generated in the first measuring unit 302 is inputted through the signal line 101 to the input buffers (gates) 207 of the second input/output terminals 205 connected to the switch circuits 102 which have been turned on. The test signal inputted to the input buffers 207 is inputted to the internal circuit of the semiconductor device 200.

The internal circuit of the semiconductor device 200 is operated in response to the test signal and the clock signal. Consequently, when the output signal is transmitted only from one of the last stage flip-flops 214, the LSI tester 300 turns on the switch circuit 102 connected to the second input/output terminal 205 fed with the output signal from the last stage flip-flop 214 and electrically connects the first input/output terminal 203 and the second input/output terminal 205 connected to the switch circuit 102 which has been turned on. On the other hand, when the output signals are transmitted from the plurality of last stage flip-flops 214, the LSI tester 300 turns on the switch circuit 102 connected to any one of the second input/output terminals 205 connected to the last stage flip-flops 214, and electrically connects the first input/output terminal 203 and the second input/output terminal 205 connected to the switch circuit 102 which has been turned on.

One of the switch circuits is turned on thus, so that the output signal supplied to the outside of the semiconductor device 200 from the second input/output terminal 205 connected to the switch circuit having been turned on is transmitted to the first measuring unit 302 of the LSI tester 300.

The first measuring unit 302 observes the output signal. The LSI tester 300 compares the logical value of the output signal having been observed in the first measuring unit 302 with the expected value (the logical value of the test signal) at a desired time, and measures the delay time and so on of the output signal relative to the reference signal based on the comparison result. In this case, a phase difference between the desired time and the rising edge or the falling edge of the reference signal is an AC timing characteristic value to be tested. For example, the AC timing characteristic value corresponds to a setup time and a hold time.

In the first embodiment, when the AC timing characteristics of the output signal are tested, the test signal generated in the LSI tester is inputted to the internal circuit of the semiconductor device 200 through the external terminal of the semiconductor device 200. The test signal may be generated by a test signal generating circuit provided beforehand in the semiconductor device 200.

Further, in the first embodiment, the input signal and the output signal of the semiconductor device are logical signals, that is, the semiconductor device is a logic LSI and the like. As a matter of course, the present invention can be similarly implemented even when the input signal and the output signal are pulse signals other than a logical signal. Moreover, the present invention can be similarly implemented in an analog-digital mixed LSI and so on. In the case of an analog-digital mixed LSI, an LSI tester generates, for example, an AC sine wave signal as a test signal at any given time. Further, the LSI tester compares the voltage of an AC signal (output signal) from the semiconductor device with a specified value and observes the voltage. Moreover, based on the observation result, the LSI tester measures the delay time and so on of the AC signal from the semiconductor device relative to a reference signal.

As described above, the semiconductor testing circuit 100 is provided in the semiconductor device 200 that is a device to be measured. Thus it is possible to test the AC characteristics of the semiconductor device 200 with a small number of terminals of the semiconductor device 200. Particularly, in a test on the AC characteristics of the input signal, a large number of terminals can be simultaneously tested.

The following will describe modifications of the first embodiment. The semiconductor testing methods of the following modifications are similar to the semiconductor testing method using the semiconductor testing circuit of FIG. 1 and thus the explanation thereof is omitted.

Figure 3:
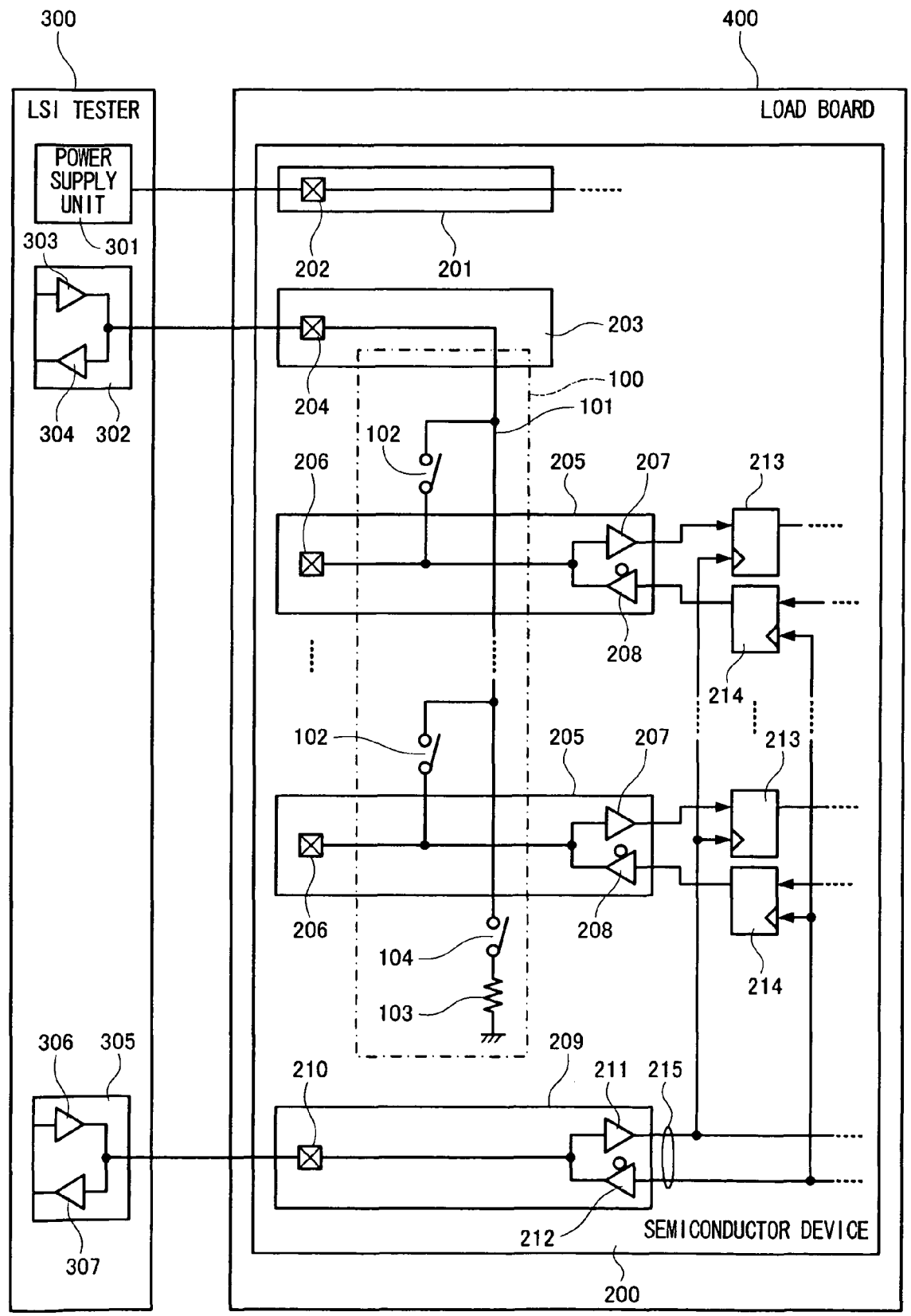
FIG. 3 is a schematic diagram showing an example of the test configuration of a semiconductor device including a first modification of the semiconductor testing circuit according to the first embodiment of the present invention.

FIG. 3 schematically shows the test configuration of a semiconductor device including a first modification of the semiconductor testing circuit according to the first embodiment of the present invention. Members corresponding to the members illustrated in FIG. 1 are indicated by the same reference numerals and the explanation thereof is omitted.

As shown in FIG. 3, the first modification of the semiconductor testing circuit is different from the semiconductor testing circuit of FIG. 1 in that a switch circuit (second switch circuit) 104 for controlling electrical connection/disconnection between one end of a signal line 101 and a resistor 103 is provided between the end of the signal line 101 and the resistor 103.

With this configuration, when AC characteristics are tested, the switch circuit 104 is turned on to electrically connect the signal line 101 and the resistor 103, thereby suppressing the reflection of a pulse signal such as a logical signal or an AC signal. Further, when DC characteristics are tested, the switch circuit 104 is turned off to disconnect the signal line 101 from the resistor 103, so that the DC characteristics can be tested without considering a current or voltage divided by the resistor 103.

The switch circuit 104 can be turned on/off by providing a circuit in, for example, a semiconductor device 200 to turn on/off the switch circuit 104 according to an instruction signal optionally generated in the LSI tester 300.

Figure 4:
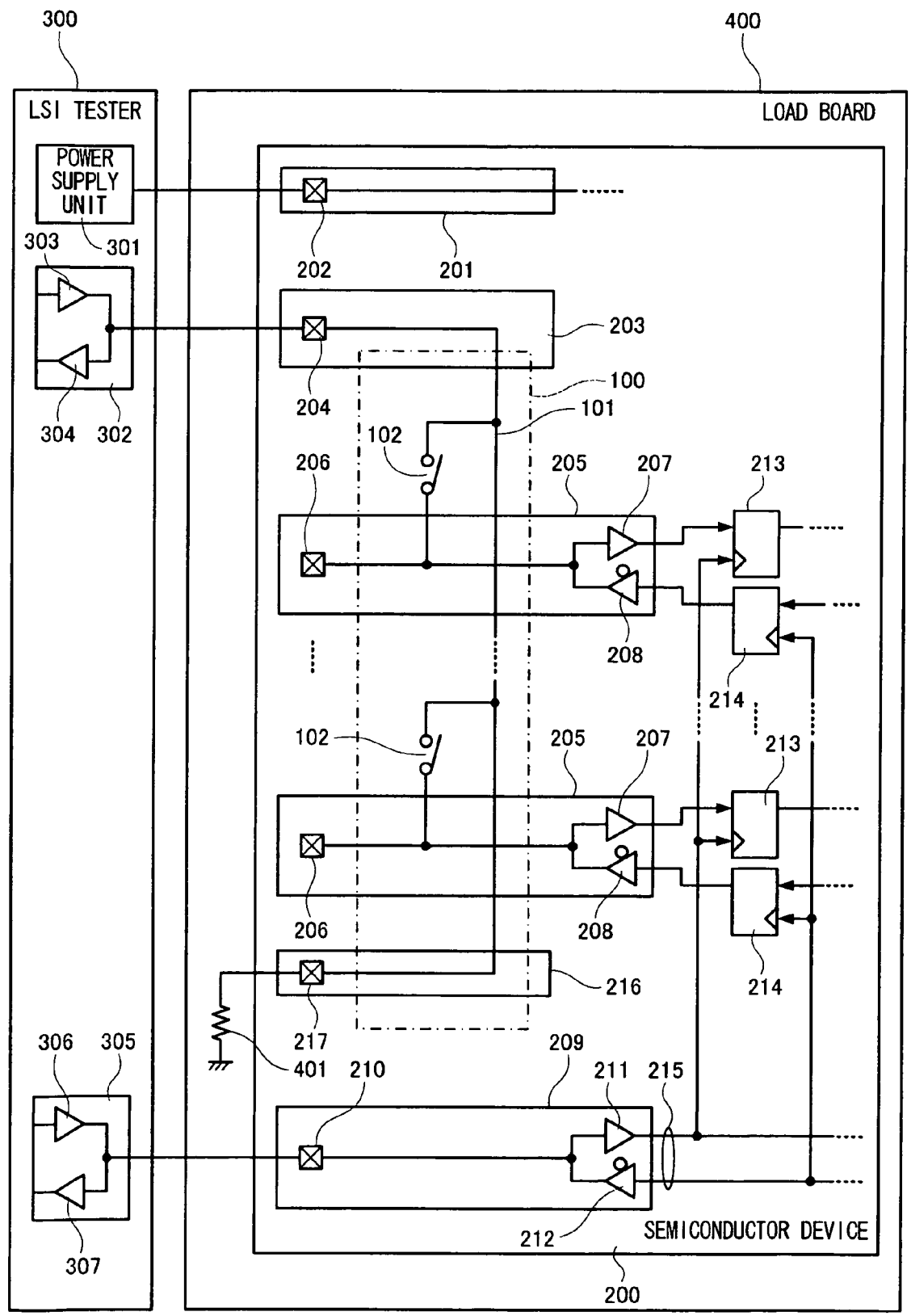
FIG. 4 is a schematic diagram showing an example of the test configuration of a semiconductor device including a second modification of the semiconductor testing circuit according to the first embodiment of the present invention.

The following will describe a second modification of the semiconductor testing circuit according to the first embodiment of the present invention. FIG. 4 schematically shows the test configuration of a semiconductor device including the second modification of the semiconductor testing circuit according to the first embodiment of the present invention. Members corresponding to the members illustrated in FIG. 1 are indicated by the same reference numerals and the explanation thereof is omitted.

As shown in FIG. 4, the second modification of the semiconductor testing circuit is different from the semiconductor testing circuit of FIG. 1 in that a resistor 401 connected to one end of a signal line 101 is provided outside a semiconductor device 200, that is, on a load board 400. To be specific, the end of the signal line 101 is connected to a pad 217 of an external terminal 216 of the semiconductor device 200 which is connected via the load board 400 to the resistor 401 provided on the load board 400.

With this configuration, it is not necessary to form, on the semiconductor device 200, the resistor connected to the end of the signal line 101. Thus it is possible to suppress the uneven characteristics of termination resistors between semiconductor devices and reduce the circuit area of the semiconductor device.

When the external terminal 216 is a terminal only for a test, as shown in FIG. 4, the signal line 101 may be directly connected to the external terminal 216. When the external terminal 216 is a terminal for actual use, the signal line 101 may be disconnected from the external terminal 216 during actual use by providing a switch circuit for controlling electrical connection/disconnection between the signal line 101 and the external terminal 216.

Figure 5:
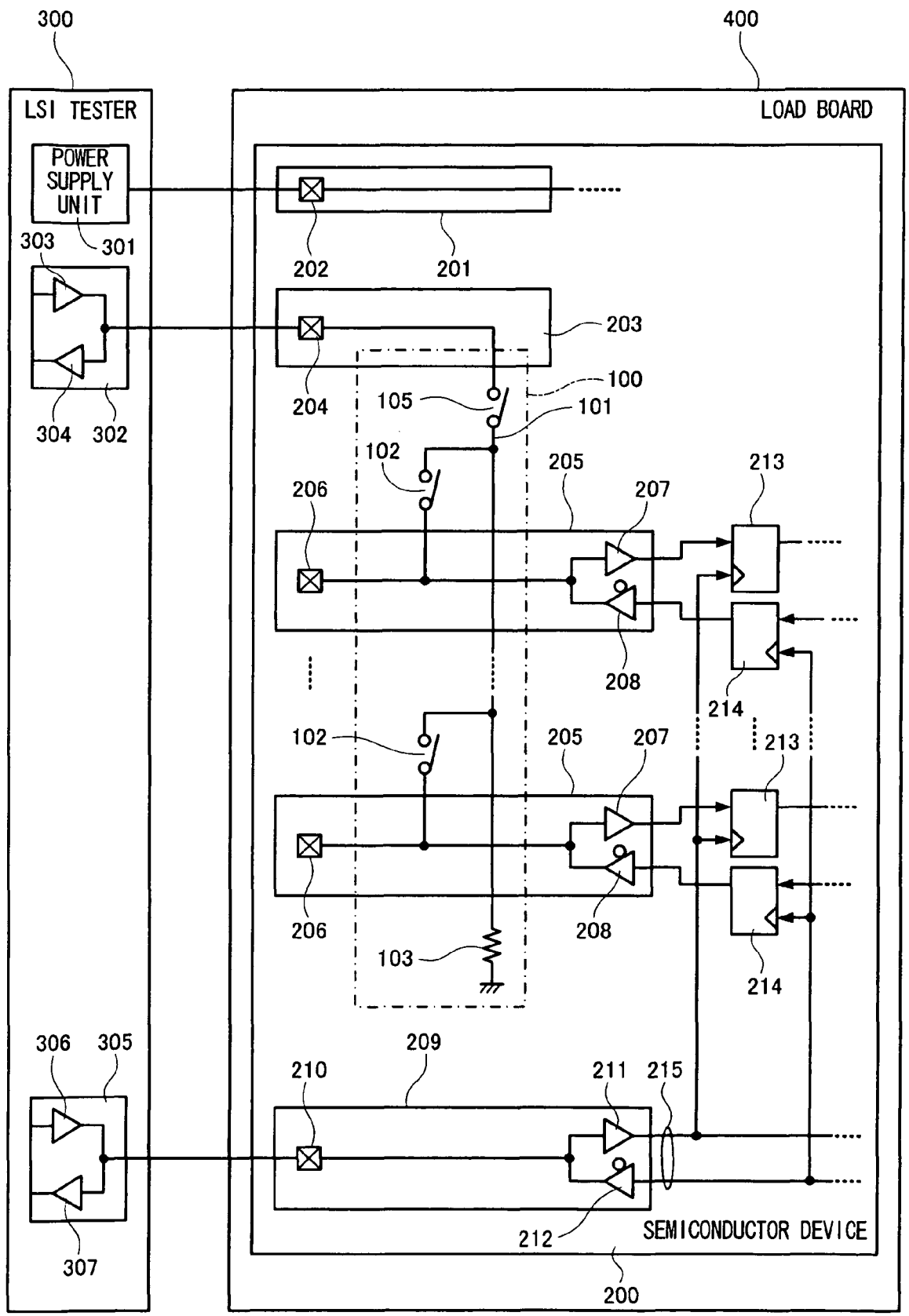
FIG. 5 is a schematic diagram showing an example of the test configuration of a semiconductor device including a third modification of the semiconductor testing circuit according to the first embodiment of the present invention.

The following will describe a third modification of the semiconductor testing circuit according to the first embodiment of the present invention. FIG. 5 schematically shows the test configuration of a semiconductor device including the third modification of the semiconductor testing circuit according to the first embodiment of the present invention. Members corresponding to the members illustrated in FIG. 1 are indicated by the same reference numerals and the explanation thereof is omitted.

As shown in FIG. 5, the third modification of the semiconductor testing circuit is different from the semiconductor testing circuit of FIG. 1 in that a switch circuit (third switch circuit) 105 is provided for controlling electrical connection/disconnection between a first input/output terminal 203, which is connected to an LSI tester 300, and a signal line 101.

With this configuration, when AC characteristics are tested, the signal line 101 and the first input/output terminal 203 can be electrically connected to each other by turning on the switch circuit 105, and the signal line 101 can be disconnected from the first input/output terminal 203 during actual use. Therefore, the first input/output terminal 203 connected to the signal line 101 does not have to be a terminal only for a test and can be an external terminal applicable to actual use.

The switch circuit 105 can be turned on/off by providing a circuit in, for example, a semiconductor device 200 to turn on/off the switch circuit 105 according to an instruction signal optionally generated in the LSI tester 300.

As described above, according to the first embodiment, in a test on the AC characteristics of the input signal, the test signal can be simultaneously inputted from the single input/output terminal to the plurality of input/output terminals and a large number of terminals can be simultaneously tested using a small number of terminals. In the first embodiment, the terminals to be tested are input/output terminals. An input terminal and an output terminal can be similarly tested.

Second Embodiment

Figure 6:
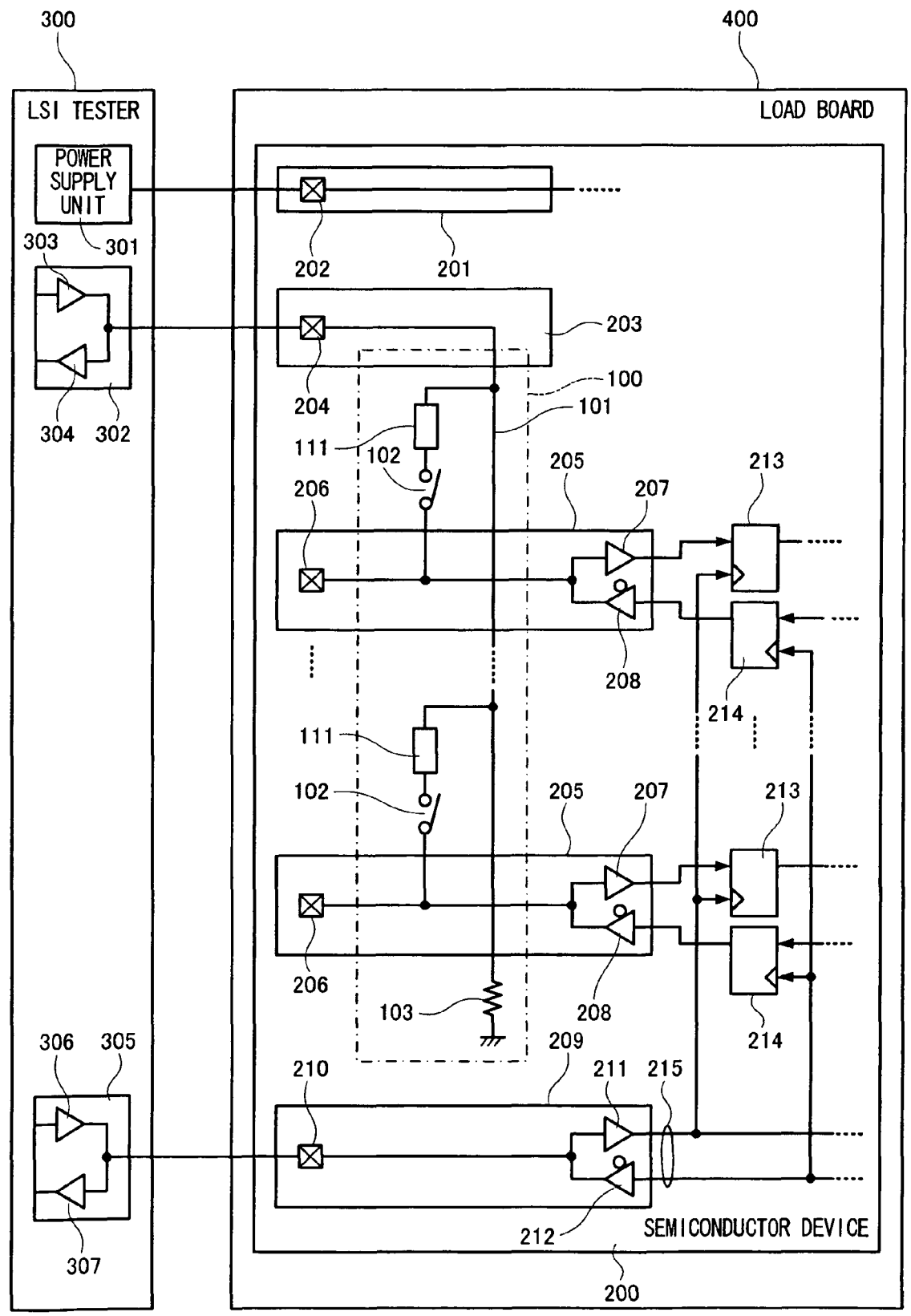
FIG. 6 is a schematic diagram showing an example of the test configuration of a semiconductor device including a semiconductor testing circuit according to a second embodiment of the present invention.

FIG. 6 schematically shows the test configuration of a semiconductor device including a semiconductor testing circuit according to a second embodiment of the present invention. Members corresponding to the members illustrated in the first embodiment are indicated by the same reference numerals and the explanation thereof is omitted. The configurations of an LSI tester and the semiconductor device are partially shown in FIG. 6.

The semiconductor testing circuit of the second embodiment is used for testing the AC characteristics of an input signal of the semiconductor device such as an LSI. The second embodiment will describe an example of a test on the AC timing characteristics of the input signal of the semiconductor device in which first stage flip-flops and last stage flip-flops are respectively connected to a plurality of input/output terminals. As a matter of course, the use of the semiconductor testing circuit and the semiconductor testing method of the present invention is not limited to the semiconductor device configured thus. The following will describe a test on a single semiconductor device. As a matter of course, a plurality of semiconductor devices can be simultaneously tested.

As shown in FIG. 6, a semiconductor testing circuit 110 is different from the semiconductor testing circuit 100 illustrated in the first embodiment in that input condition setting circuits 111 are provided between terminals to be tested (second input/output terminals 205) and a signal line (first signal line) 101. The input condition setting circuit 111 can change the input conditions (logical value and delay amount) of each signal inputted from the signal line 101 to each terminal to be tested through a switch circuit (first switch circuit) 102.

In the first embodiment, the same test signals are simultaneously inputted to terminals to be tested during a test on the AC timing characteristics of the input signal, whereas in the second embodiment, with the input condition setting circuits 111, the logical values of test signals simultaneously inputted to terminals to be tested can be respectively set for the terminals to be tested. Further, in the first embodiment, during a test on the AC timing characteristics of the input signal, the test signals are inputted at the same input timing to terminals to be tested, whereas in the second embodiment, the input condition setting circuits 111 can set input timing (delay amount) respectively for terminals to be tested.

Figure 7:
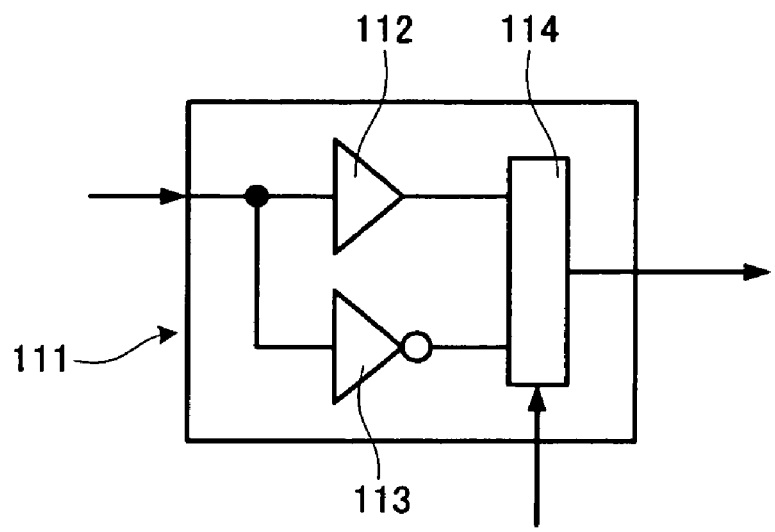
FIG. 7 shows a structural example of an input condition setting circuit included in the semiconductor testing circuit according to the second embodiment of the present invention.
Figure 8:
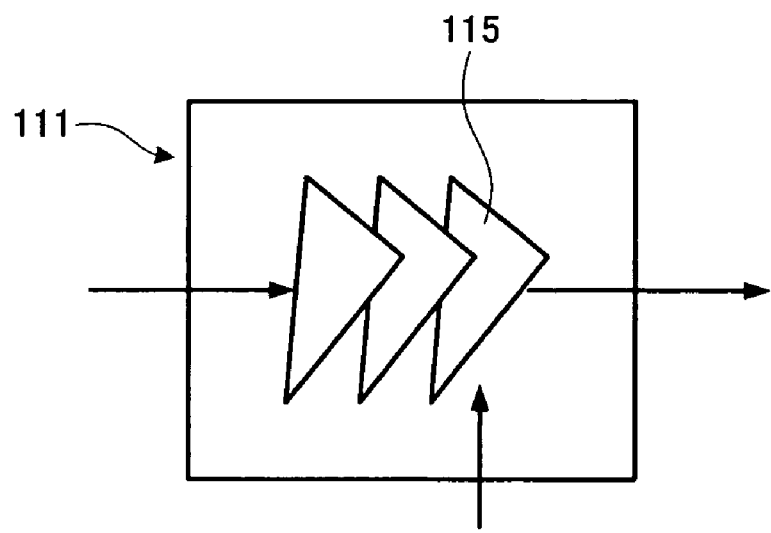
FIG. 8 shows a structural example of the input condition setting circuit included in the semiconductor testing circuit according to the second embodiment of the present invention.

For example, the input condition setting circuit 111 can be made up of a logical circuit including a buffer 112, an inverter 113, and a selector 114 as shown in FIG. 7, or made up of a delay circuit including a plurality of delay elements 115 connected in series as shown in FIG. 8. Moreover, the input condition setting circuit 111 may be a combined circuit (not shown) of the logical circuit of FIG. 7 and the delay circuit of FIG. 8. The logical value and the delay amount of the input condition setting circuit 111 can be set by providing a circuit in, for example, a semiconductor device 200 to set the logical value and the delay amount of the input condition setting circuit 111 according to an instruction signal optionally generated in an LSI tester 300.

In a test on the AC timing characteristics of the input signal, the delay time of a signal transmitted between the pad of the terminal to be tested and the first stage flip-flop is observed. Thus the signal line 101 is connected as close as possible to the pads of the terminals to be tested. Further, in order to transmit a signal having an undistorted waveform through the signal line 101, the lengths of the branch parts of the signal line 101 are minimized. Therefore, it is preferable to form the semiconductor testing circuit 110 in a region under a region where the pads of the terminals to be tested are formed.

Figure 9:
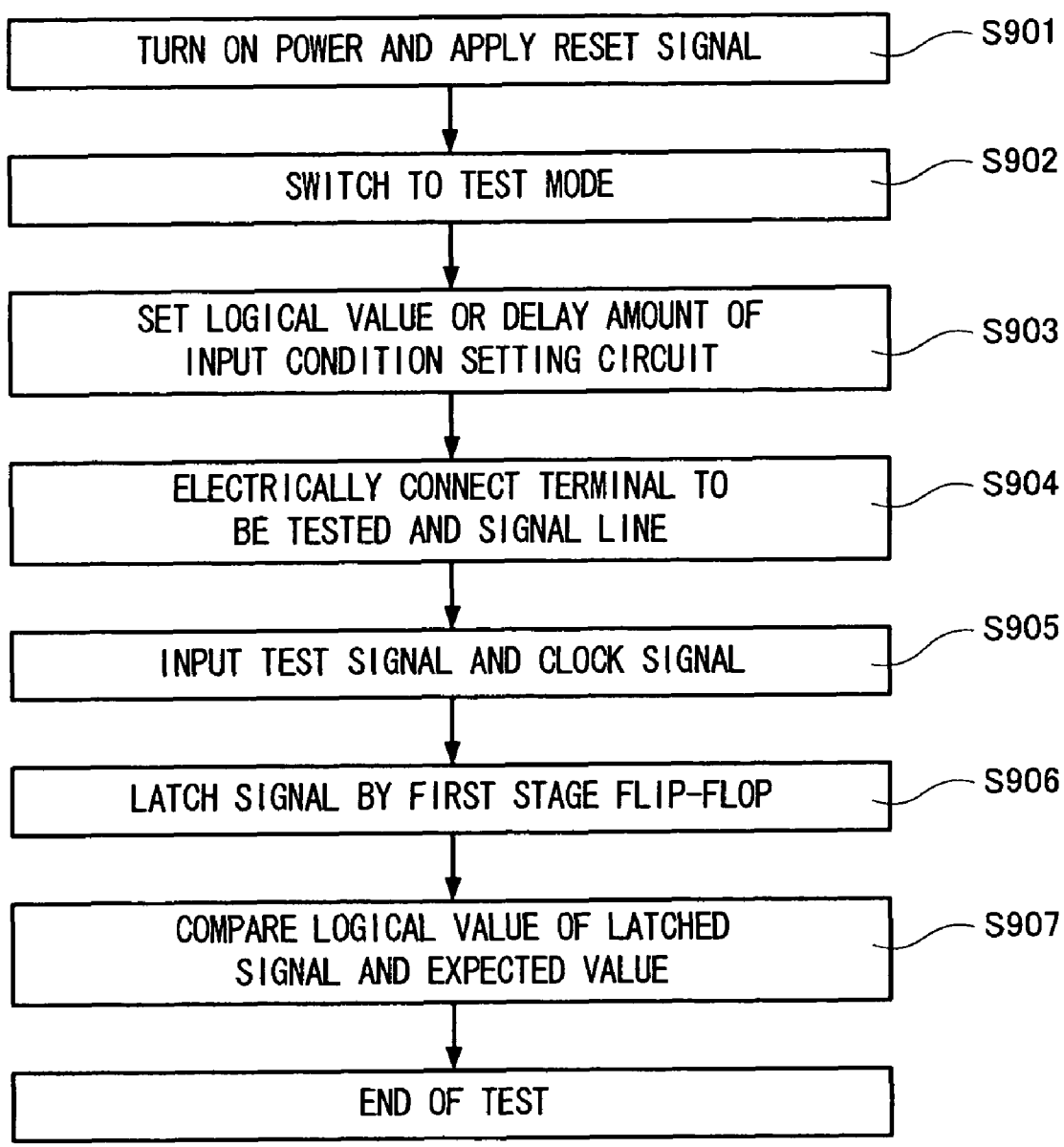
FIG. 9 is a flowchart showing an example of a semiconductor testing method according to the second embodiment of the present invention.

Referring to FIG. 9, the following will describe an example of a method of testing the AC timing characteristics of the input signal, as a semiconductor testing method according to the second embodiment of the present invention.

First, the LSI tester 300 starts power supply (power-up) to a semiconductor device 200 that is a device to be measured, and then applies a reset signal to the semiconductor device 200 (step S901). Thereafter, the LSI tester 300 switches the semiconductor device 200 to a state (test mode) in which the AC timing characteristics of the input signal are tested (step S902).

Next, the LSI tester 300 sets the logical values and the delay amounts of the input condition setting circuits 111 (step S903). Thus the logical value and the input timing (delay amount) of a test signal are set for each of the second input/output terminals 205 that are terminals to be tested.

Next, the LSI tester 300 turns on the switch circuits 102 connected to the second input/output terminals 205 to be simultaneously tested, and electrically connects the second input/output terminals 205 to the signal line 101 (step S904).

Then, the LSI tester 300 generates, in a first measuring unit 302, the test signal for testing the AC timing characteristics of the input signal, inputs the test signal to the signal line 101 through a first input/output terminal 203, generates a clock signal in a second measuring unit 305 at a desired time, and inputs the clock signal to an internal clock tree 215 through a clock terminal 209 (step S905). A desired phase difference is set between the clock signal and the test signal. The set value of the phase difference is an AC timing characteristic value to be tested and corresponds to, for example, a setup time and a hold time. When the input timing of the test signal can be changed by the input condition setting circuit 111, the AC timing characteristic value of each terminal to be tested can be set by the input condition setting circuit 111.

The test signal generated in the first measuring unit 302 is inputted through the input condition setting circuits 111 to input buffers (gates) 207 of the second input/output terminals 205 to be simultaneously tested. Therefore, the input buffers 207 of the second input/output terminals 205 are fed with the test signals whose logical values and delay amounts have been set by the input condition setting circuits 111. The test signals having been inputted to the input buffers 207 are inputted to the data input pins of first stage flip-flops 213.

On the other hand, the clock signal generated in the second measuring unit 305 is inputted to the clock pins of the first stage flip-flops 213 through a part of the internal clock tree 215.

The first stage flip-flop 213 latches the signal inputted to the data input pin, at the rising edge or the falling edge of the clock signal (step S906). The signal latched by the first stage flip-flop 213 is compared with an expected value in a comparator circuit (not shown) provided beforehand in the semiconductor device 200 (step S907). The expected value is the logical value of the test signal. Based on the comparison result, it is possible to measure the delay time and so on of the input signal relative to a reference signal. The signal latched by the first stage flip-flop 213 may be transmitted from an external terminal (not shown) of the semiconductor device 200 to the LSI tester 300 and may be compared with the expected value in the LSI tester 300.

As described above, according to the second embodiment, the input conditions (logical value, delay amount, and so on) of terminals to be tested can be set in a test on the AC characteristics of the input signal. Thus it is possible to simultaneously test a larger number of terminals.

In the second embodiment, the input signal of the semiconductor device is a logical signal, that is, the semiconductor device is a logic LSI and the like. As a matter of course, the present invention can be similarly implemented even when the input signal is a pulse signal other than a logical signal. Moreover, the present invention can be similarly implemented in an analog-digital mixed LSI and so on. In the case of an analog-digital mixed LSI, the input condition setting circuit 111 may delay the phase of an AC signal serving as a test signal.

As in the semiconductor testing circuit of the first embodiment, a switch circuit (second switch circuit) for controlling electrical connection/disconnection between one end of the signal line 101 and a resistor 103 may be provided between the end of the signal line 101 and the resistor 103 (first modification), a resistor may be provided outside the semiconductor device 200 so as to be connected to the end of the signal line 101 (second modification), or a switch circuit (third switch circuit) may be provided for controlling electrical connection/disconnection between the first input/output terminal 203 not to be tested and the signal line 101 (third modification).

In the second embodiment, the terminal to be tested is an input/output terminal. An input terminal can be similarly tested.

Further, the switch circuit 102 for controlling electrical connection/disconnection between the second input/output terminal 205 to be tested and the signal line 101 may be changed among a state in which the second input/output terminal 205 is electrically connected to the signal line 101 via the input condition setting circuit 111, a state in which the second input/output terminal 205 is electrically connected to the signal line 101 not via the input condition setting circuit 111, that is, the second input/output terminal 205 is directly and electrically connected to the signal line 101, and a state in which the second input/output terminal 205 is electrically disconnected from the signal line 101. Thus as in the first embodiment, the AC timing characteristics of an output signal can be tested.

Third Embodiment

Figure 10:
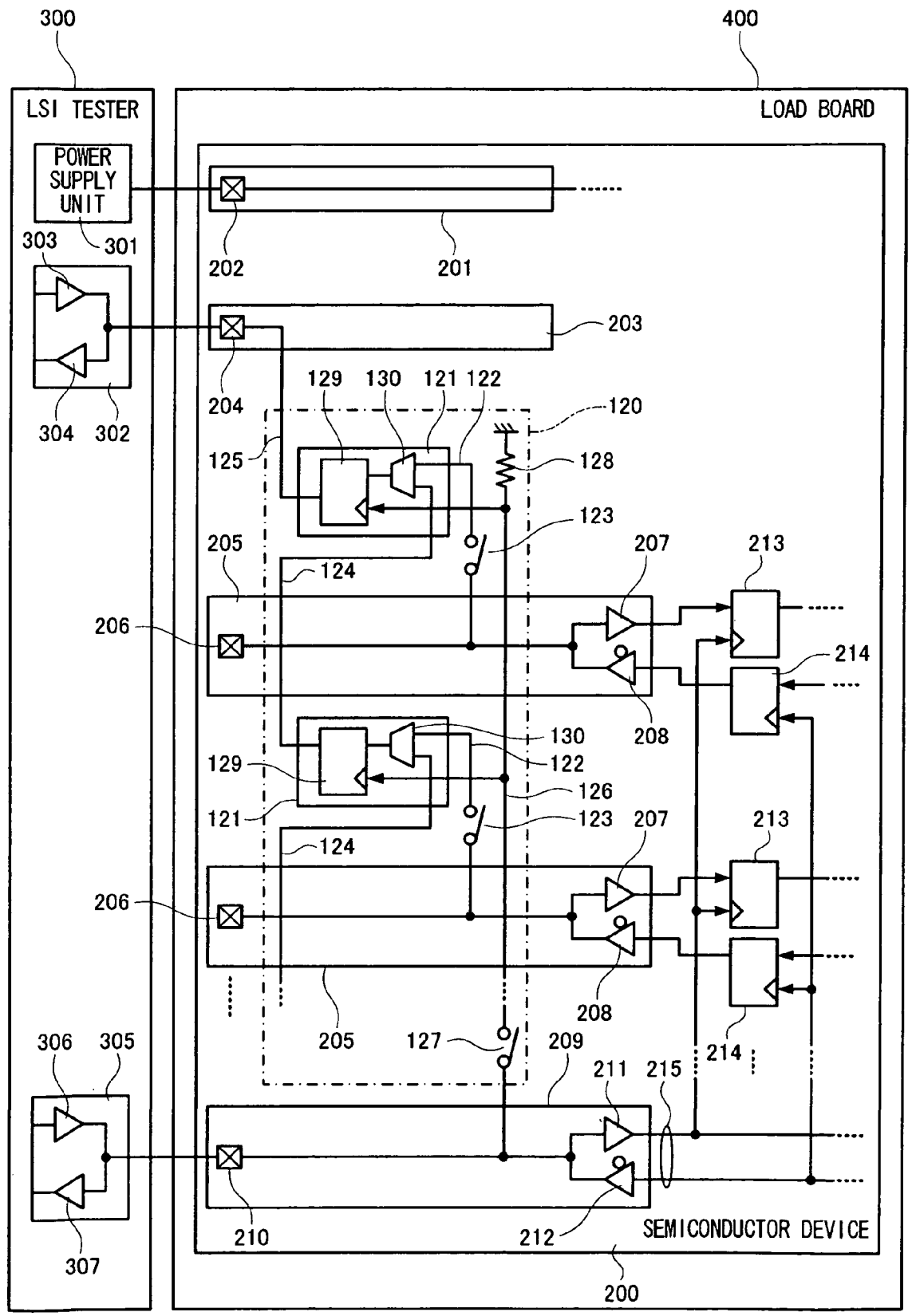
FIG. 10 is a schematic diagram showing an example of the test configuration of a semiconductor device including a semiconductor testing circuit according to a third embodiment of the present invention.

FIG. 10 schematically shows the test configuration of a semiconductor device including a semiconductor testing circuit according to a third embodiment of the present invention. Members corresponding to the members illustrated in the first embodiment are indicated by the same reference numerals and the explanation thereof is omitted. The configurations of an LSI tester and the semiconductor device are partially shown in FIG. 10.

The semiconductor testing circuit of the third embodiment is used for testing the AC characteristics of an output signal of the semiconductor device such as an LSI. The third embodiment will describe an example of a test on the AC timing characteristics of the output signal of the semiconductor device in which first stage flip-flops and last stage flip-flops are respectively connected to a plurality of input/output terminals. As a matter of course, the use of the semiconductor testing circuit and the semiconductor testing method of the present invention is not limited to the semiconductor device configured thus. The following will describe a test on a single semiconductor device. As a matter of course, a plurality of semiconductor devices can be simultaneously tested.

A semiconductor testing circuit 120 is different from the semiconductor testing circuit 100 of the first embodiment in that output signals transmitted from a plurality of last stage flip-flops 214 are captured from second input/output terminals 205 connected to the last stage flip-flops 214, and are serially transferred to a first input/output terminal 203 connected to an LSI tester 300.

The semiconductor testing circuit 120 will be specifically described below. In FIG. 10, a flip-flop circuit 121 provided with a selector for each of the second input/output terminals 205 to be tested includes a flip-flop 129 having a first input pin (data input pin), a clock pin, and an output pin (data output pin), and a selector 130 having a second input pin and a third input pin one of which is electrically connected to the first input pin of the flip-flop 129.

Each of the second input pins of the selectors 130 is connected to a signal line 122. Each of the signal lines 122 is connected near a pad 206 of the second input/output terminal 205 to be tested, via a switch circuit (fourth switch circuit) 123. Each of the switch circuits 123 controls electrical connection/disconnection between the second input pin of the selector 130 and the second input/output terminal 205 to be tested.

Of the flip-flop circuits 121 with the selectors, in each of the flip-flop circuits 121 other than the last stage flip-flop circuit 121 with the selector near the first input/output terminal 203 that is connected to the LSI tester 300 and is not to be tested, each of the third input pins of the selectors 130 is connected to the output pin of the flip-flop 129 of the adjacent flip-flop circuit 121 with the selector via a signal line (third signal line) 124. On the other hand, the third input pin of the last stage flip-flop circuit 121 with the selector is not connected to the output pins of the other flip-flop circuits with the selectors but is connected near a pad 204 of the first input/output terminal 203 via a signal line (third signal line) 125.

The clock pins of the flip-flops 129 of the flip-flop circuits 121 with the selectors are connected to a signal line (second signal line) 126. The signal line 126 is connected to a clock terminal 209 serving as a reference terminal, via a switch circuit (fifth switch circuit) 127. The switch circuit 127 controls electrical connection/disconnection between the signal line 126 and the clock terminal 209.

To one end of the signal line 126, a resistor (second resistor) 128 is connected as a termination resistor. The resistor 128 is disposed near the second input/output terminal 205 farthest from the junction point of the clock terminal 209 and the signal line 126. The resistor 128 can suppress the reflection of a clock signal transmitted through the signal line 126.

The flip-flop circuits 121 with the selectors, the signal lines 122, the switch circuits 123, the signal lines 124, the signal line 125, the signal line 126, the switch circuit 127, and the resistor 128 are formed on a semiconductor device 200.

With this configuration, an output signal transmitted from an output buffer 208 of the second input/output terminal 205 can be inputted to the flip-flop circuit 121 with the selector through the signal line 122, and the output signal can be latched by the flip-flop circuit 121 with the selector. The flip-flop circuits 121 with the selectors are connected in series via the signal lines 124, so that the signals latched by the flip-flop circuits 121 with the selectors can be serially transmitted to the first input/output terminal 203 through the signal lines 124 and 125.

One of the input pins of the selector 130 is electrically connected to the first input pin of the flip-flop 129 and the connected pin is selected by providing a circuit (not shown) in, for example, the semiconductor device 200 to operate the selector 130 according to an instruction signal optionally generated in the LSI tester 300.

The switch circuits 123 and 127 are turned on/off by providing a circuit (not shown) in, for example, the semiconductor device 200 to turn on/off the switch circuits 123 and 127 according to instruction signals optionally generated in the LSI tester 300.

With this configuration, when the AC timing characteristics of the output signal are tested, the switch circuits 123 and 127 are turned on and thus the output signals transmitted from the output buffers 208 of the second input/output terminals 205 to be tested can be latched by the flip-flop circuits 121 with the selectors. Further, only necessary ones of the multiple terminals to be tested can be electrically connected to the flip-flop circuits 121 with the selectors.

During a normal operation of the semiconductor device 200, the switch circuits 123 and 127 are turned off, so that the input/output terminals 205 to be tested and the clock terminal 209 can be disconnected from the semiconductor testing circuit 120. Thus during a normal operation of the semiconductor device 200, the semiconductor testing circuit 120 does not affect the operation of the internal circuit of the semiconductor device 200.

In a test on the AC timing characteristics of the output signal, the delay time of a signal transmitted between the pad of the terminal to be tested and the last stage flip-flop is observed. Thus the signal lines 122 are connected as close as possible to the pads of the terminals to be tested. Further, in order to transmit a signal having an undistorted waveform through the signal lines 122, 124, 125 and 126, the lengths of the signal lines 122, 124, 125 and 126 are minimized. Therefore, it is preferable to mount the semiconductor testing circuit 120 under the terminals to be tested.

Figure 11:
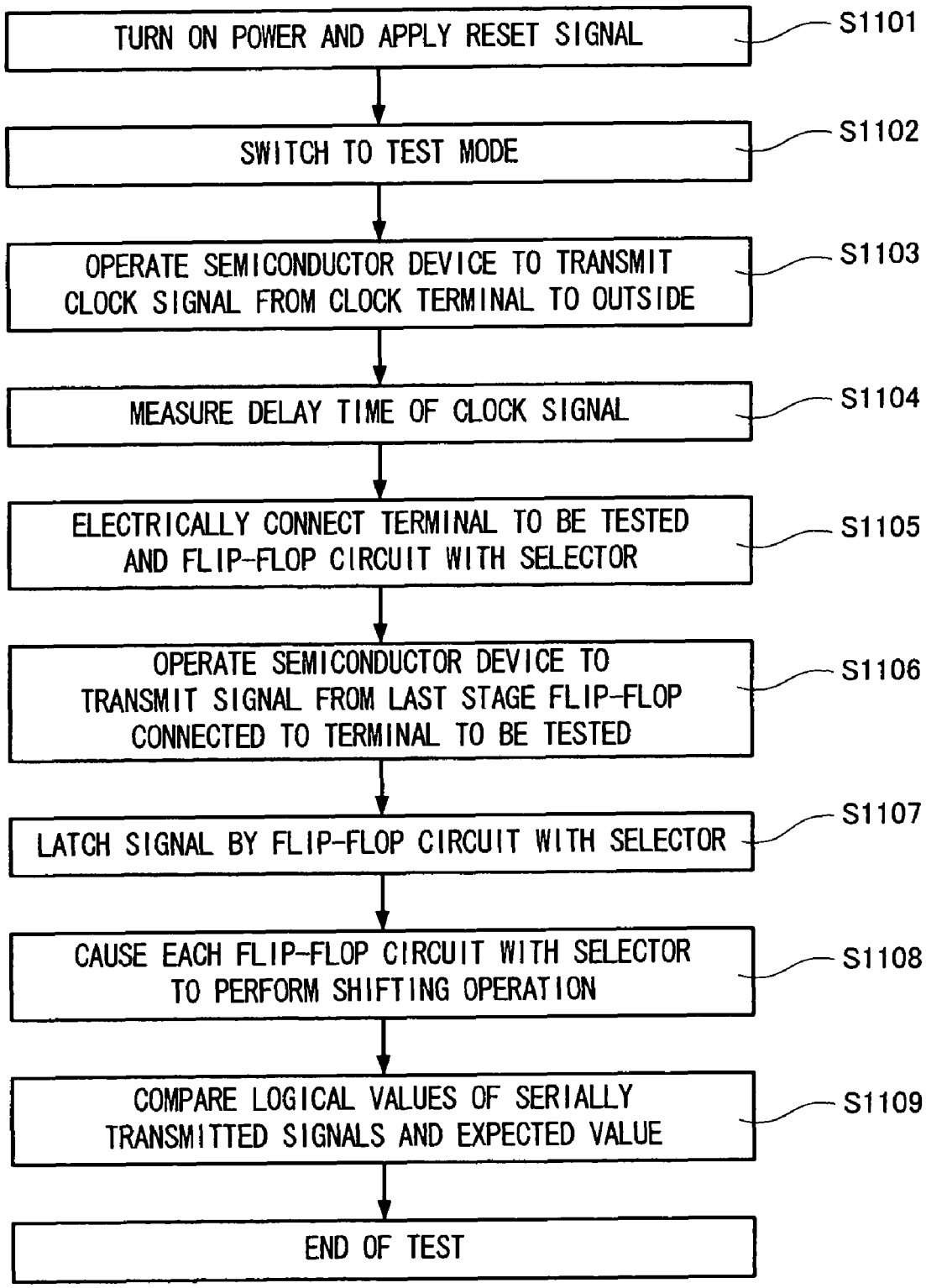
FIG. 11 is a flowchart showing an example of a semiconductor testing method according to the third embodiment of the present invention.

Referring to FIG. 11, the following will describe an example of a method of testing the AC timing characteristics of the output signal, as a semiconductor testing method according to the third embodiment of the present invention.

First, the LSI tester 300 starts power supply (power-up) to the semiconductor device 200, and then applies a reset voltage to the semiconductor device 200 (step S1101). Thereafter, the LSI tester 300 switches the semiconductor device 200 to a state (test mode) in which the AC timing characteristics of the output signal are tested (step S1102).

Next, the LSI tester 300 operates the internal circuit of the semiconductor device 200 to transmit a clock signal (output clock signal) having passed through an internal clock tree 215, from the clock terminal 209 to the LSI tester 300 (step S1103). When the internal circuit of the semiconductor device 200 is operated, the LSI tester 300 generates a clock signal for operating the internal circuit of the semiconductor device 200 and supplies the generated clock signal to the semiconductor device 200. Moreover, a data signal for operating the internal circuit of the semiconductor device 200 may be generated in the LSI tester 300 or in the semiconductor device 200.

Next, the LSI tester 300 observes the output clock signal from the clock terminal 209 in a second measuring unit 305 and measures the delay time (delay amount) and so on of the output clock signal relative to a reference signal based on the observation result (step S1104).

Then, the LSI tester 300 turns on the switch circuits 123 to electrically connect the second input/output terminals 205 and the second input pins of the selectors 130 of the flip-flop circuits 121 with the selectors, turns on the switch circuit 127 to electrically connect the signal line 126 and the clock terminal 209 serving as a reference terminal, and operates the selectors 130 of the flip-flop circuits 121 with the selectors so as to electrically connect the first input pins of the flip-flops 129 and the second input pins (the second input/output terminals 205 to be tested) of the selectors 130 in the flip-flop circuits 121 with the selectors (step S1105).

Next, the LSI tester 300 operates the internal circuit of the semiconductor device 200 again to transmit output signals from the last stage flip-flops 214 (step S1106). At this point, the clock terminal 209 is inhibited from supplying the output clock signal to the outside of the semiconductor device 200. To be specific, an output buffer 212 of the clock terminal 209 is disabled. Further, when the internal circuit of the semiconductor device 200 is operated, the LSI tester 300 generates a clock signal for operating the internal circuit of the semiconductor device 200 and supplies the generated clock signal to the semiconductor device 200. A data signal for operating the internal circuit of the semiconductor device 200 may be generated in the LSI tester 300 or in the semiconductor device 200.

Next, when the output signals are transmitted from the last stage flip-flops 214, the LSI tester 300 inputs a clock signal to the clock terminal 209 at a desired time based on the delay time and so on having been measured in step S1104. A phase difference between the desired time and the timing of the rising edge or the falling edge of the reference signal is an AC timing characteristic value to be tested and corresponds to, for example, a setup time and a hold time.

As described above, when the output signals are transmitted from the last stage flip-flops 214, the clock signal generated by the second measuring unit 305 is inputted to the clock terminal 209, so that the output signals transmitted from the output buffers 208 of the second input/output terminals 205 to be tested are latched by the flip-flops 129 at the rising edge or the falling edge of the clock signal inputted to the clock pins of the flip-flops 129 of the flip-flop circuits 121 with the selectors (step S1107).

Next, the LSI tester 300 causes the flip-flop circuits 121 with the selectors to perform a shifting operation (step S1108). In other words, the LSI tester 300 operates the selectors 130 such that the first input pins of the flip-flops 129 of the flip-flop circuits 121 with the selectors are connected to the third input pins of the selectors 130. Thereafter, the LSI tester 300 generates a clock signal in the second measuring unit 305 and serially transmits the output signals having been latched by the flip-flop circuits 121 with the selectors, to the first input/output terminal 203.

The output signals having been inputted to the first input/output terminal 203 are serially transmitted to a first measuring unit 302 of the LSI tester 300. The LSI tester 300 observes the transmitted output signals in the first measuring unit 302. Then, the LSI tester 300 compares the logical values of the observed output signals with an expected value and measures the delay times and so on of the output signals relative to the reference signal based on the comparison result. The expected value is the logical value of a test signal.

As described above, in a test on the AC characteristics of the output signals according to the third embodiment, the output signals simultaneously supplied from the multiple terminals to be tested to the outside of the semiconductor device can be serially transmitted from the single input/output terminal to the LSI tester, so that a large number of terminals can be simultaneously tested using a small number of terminals.

As in the second and third modifications of the semiconductor testing circuit according to the first embodiment, a resistor connected to the end of the signal line 126 may be provided outside the semiconductor device 200 and a switch circuit (sixth switch circuit) may be provided for controlling electrical connection/disconnection between the first input/output terminal 203 not to be tested and the signal line 125 (the output pin of the flip-flop 129 of the last stage flip-flop circuit 121 with the selector).

In the third embodiment, the terminals to be tested are input/output terminals. An output terminal can be similarly tested.

Further, in the third embodiment, the output signal of the semiconductor device is a logical signal, that is, the semiconductor device is a logic LSI and the like. As a matter of course, the present invention can be similarly implemented even when the output signal is a pulse signal other than a logical signal.

What is claimed is:

1. A semiconductor testing circuit for testing AC characteristics of a semiconductor device, comprising:
   a first signal line connected to a terminal not to be tested and a plurality of terminals to be tested of the semiconductor device;
   first switch circuits for controlling electrical connection/disconnection between the terminals to be tested and the first signal line;
   a first resistor connected to one end of the first signal line; and
   a second switch circuit for controlling electrical connection/disconnection between the first signal line and the terminal not to be tested,
   wherein at least the first signal line and the first switch circuits are formed on the semiconductor device.

2. A semiconductor testing circuit for testing AC characteristics of a semiconductor device, comprising:
   a first signal line connected to a terminal not to be tested and a plurality of terminals to be tested of the semiconductor device;
   first switch circuits for controlling electrical connection/disconnection between the terminals to be tested and the first signal line;
   a first resistor connected to one end of the first signal line; and
   input condition setting circuits respectively between the terminals to be tested and the first signal line, the input condition setting circuit being capable of changing one of a logical value and a delay amount of a signal inputted from the first signal line to the terminal to be tested through the first switch circuit,
   wherein at least the first signal line and the first switch circuits are formed on the semiconductor device.

3. The semiconductor testing circuit according to claim 2, wherein the first switch circuit is changed among a state in which the first signal line and the terminal to be tested are electrically connected to each other via the input condition setting circuit, a state in which the first signal line and the terminal to be tested are electrically connected to each other not via the input condition setting circuit, and a state in which the first signal line and the terminal to be tested are electrically disconnected from each other.

4. A semiconductor testing method using the semiconductor testing circuit according to claim 2, for testing AC characteristics of an input signal to terminals to be tested of a semiconductor device, the method comprising:
   operating the first switch circuits to electrically connect the terminals to be tested and the first signal line, and setting one of the logical value and the delay amount of the signal from each of the input condition setting circuits;
   inputting a test signal to the first signal line through the terminal not to be tested of the semiconductor device, supplying to the semiconductor device a clock signal having a desired phase difference from the test signal, and causing first stage flip-flops provided in an internal circuit of the semiconductor device to respectively latch signals from the terminals to be tested; and
   comparing the signals latched by the first stage flip-flops with an expected value.

5. A semiconductor testing circuit used for testing AC characteristics of a semiconductor device, comprising:
   a first signal line connected to a reference terminal of the semiconductor device, the reference terminal supplying, to outside of the semiconductor device, a clock signal having passed through an internal clock tree of the semiconductor device;
   flip-flop circuits with selectors each of which includes a flip-flop having at least an output pin, a clock pin, and a first input pin, and a selector having second and third input pins and electrically connecting the first input pin and one of the second and third input pins, the second input pins being respectively connected to terminals to be tested of the semiconductor device, the clock pins being connected to the first signal line;

first switch circuits for controlling electrical connection/disconnection between the second input pins of the flip-flop circuits with the selectors and the terminals to be tested;

second signal lines each of which connects the third input pin of a flip-flop circuit with the selectors to the output pin of an adjacent flip-flop circuit with the selector, and connects the output pin of the flip-flop circuit with the selector to a terminal not to be tested of the semiconductor device when the output pin is not connected to the third input pin;

a second switch circuit for controlling electrical connection/disconnection between the first signal line and the reference terminal; and a first resistor connected to one end of the first signal line, wherein at least the first signal line, the flip-flop circuits with the selectors, the first switch circuits, the second signal lines, and the second switch circuit are formed on the semiconductor device.

6. The semiconductor testing circuit according to claim 5, wherein the first resistor is outside the semiconductor device.

7. The semiconductor testing circuit according to claim 5, further comprising a third switch circuit for controlling electrical connection/disconnection between the terminal not to be tested and the output pin of the flip-flop circuit with the selector.

8. A semiconductor testing method using the semiconductor testing circuit according to claim 5, for testing AC characteristics of an output signal supplied from terminals to be tested of a semiconductor device to outside of the semiconductor device, the method comprising:

measuring a delay amount of the clock signal supplied from the reference terminal of the semiconductor device to outside of the semiconductor device through the internal clock tree of the semiconductor device, the reference terminal being connected to the first signal line;

operating the first switch circuits to electrically connect the terminals to be tested and the second input pins of the flip-flop circuits with the selectors, operating the second switch circuit to electrically connect the first signal line and the reference terminal, and operating the selectors of the flip-flop circuits with the selectors to electrically connect the first input pins and the second input pins of the flip-flop circuits with the selectors;

supplying a clock signal to the semiconductor device to operate an internal circuit of the semiconductor device, inputting a clock signal to the reference terminal at a desired time based on the measured delay amount when signals are supplied from last stage flip-flops in the internal circuit to the terminals to be tested, and causing the flip-flops of the flip-flop circuits with the selectors to latch the signals supplied from the terminals to be tested to the outside of the semiconductor device;

operating the selectors of the flip-flop circuits with the selectors to electrically connect the first input pins and the third input pins of the flip-flop circuits with the selectors, and serially transmitting, to the terminal not to be tested of the semiconductor device, the signals latched by the flip-flop circuits with the selectors; and comparing the signals serially transmitted to the terminal not to be tested with an expected value.

\* \* \* \* \*